United States Patent
Lee (10) Patent No.: US 9,227,203 B2
(45) Date of Patent: Jan. 5, 2016

(54) DEPOSITING APPARATUS AND METHOD FOR MANUFACTURING ORGANIC LIGHT EMITTING DIODE DISPLAY USING THE SAME

(71) Applicant: Sang-Shin Lee, Yongin (KR)

(72) Inventor: Sang-Shin Lee, Yongin (KR)

(73) Assignee: SAMSUNG DISPLAY CO., LTD., Yongin, Gyeonggi-do (KR)

(*) Notice: Subject to any disclaimer, the term of this patent is extended or adjusted under 35 U.S.C. 154(b) by 15 days.

(21) Appl. No.: 13/955,322

(22) Filed: Jul. 31, 2013

(65) Prior Publication Data
US 2014/0099740 A1  Apr. 10, 2014

(30) Foreign Application Priority Data
Oct. 9, 2012 (KR) .................. 10-2012-0112027

(51) Int. Cl.
H01L 21/00 (2006.01)
C23C 16/00 (2006.01)
B05B 1/14 (2006.01)
C23C 14/04 (2006.01)
C23C 14/24 (2006.01)
H01L 51/56 (2006.01)

(52) U.S. Cl.
CPC .................. *B05B 1/14* (2013.01); *C23C 14/042* (2013.01); *C23C 14/243* (2013.01); *H01L 51/56* (2013.01)

(58) Field of Classification Search
CPC ........ H01L 51/56; B05B 1/14; C23C 14/042; C23C 14/243

USPC ............................................ 118/726; 438/22
See application file for complete search history.

(56) References Cited

U.S. PATENT DOCUMENTS

| 3,627,569 | A  | * | 12/1971 | Beecham ...................... 427/100 |
| 7,976,636 | B2 | * | 7/2011  | Kim et al. ...................... 118/726 |
| 2006/0124061 | A1 | | 6/2006 | Saito et al. |
| 2009/0229524 | A1 | * | 9/2009 | Kim et al. ...................... 118/726 |
| 2011/0146575 | A1 | | 6/2011 | Choi et al. |
| 2012/0141674 | A1 | * | 6/2012 | Park et al. .................. 427/248.1 |

FOREIGN PATENT DOCUMENTS

| KR | 10-2006-0101987 |   | 9/2006 |
| KR | 10-2010-0108086 |   | 10/2010 |
| KR | 10-2011-0081552 | A | 7/2011 |
| KR | 10-2011-0102686 |   | 9/2011 |
| KR | 10-2012-0028628 | A | 3/2012 |

OTHER PUBLICATIONS

Extended European Search Report dated Jan. 17, 2014.

\* cited by examiner

*Primary Examiner* — Matthew Landau
*Assistant Examiner* — Igwe U Anya
(74) *Attorney, Agent, or Firm* — Lee & Morse, P.C.

(57) ABSTRACT

A deposition apparatus includes a deposition source that receives a deposition material, and a plurality of spray nozzles arranged in a first direction at one side of the deposition source to spray the deposition material to a facing substrate. The deposition source includes a center area and outer areas, the outer areas being at respective ends of the center area with reference to the first direction. The spray nozzles include first spray nozzles arranged in each outer area and extending outwardly from the deposition source, a surface forming an end of the first spray nozzles forming a first inclination angle with a substrate surface in the first direction.

10 Claims, 6 Drawing Sheets

DEPOSITING APPARATUS AND METHOD FOR MANUFACTURING ORGANIC LIGHT EMITTING DIODE DISPLAY USING THE SAME

CROSS-REFERENCE TO RELATED APPLICATION

The present application claims priority under 35 U.S.C. §119 to Korean Patent Application No. 10-2012-0112027, filed on Oct. 9, 2012, in the Korean Intellectual Property Office, and entitled: "Depositing Apparatus and Method for Manufacturing Organic Light Emitting Diode Display Using the Same," which is incorporated by reference herein in its entirety.

BACKGROUND

1. Field

Embodiments relate to a deposition apparatus and a manufacturing method of an organic light emitting diode (OLED) display using the same.

2. Description of the Related Art

Among display devices, an organic light emitting display has a wide viewing angle, excellent contrast, and a fast response speed. Thus, the organic light emitting display has been in the limelight as the next-generation display device.

In general, the organic light emitting display has a structure in which an emission layer is inserted between an anode and a cathode to realize colors. Light emission may occur from the re-combination of holes and electrons emitted from the anode and the cathode in the emission layer. In addition, to provide greater light emission efficiency, intermediate layers such as an electron injection layer (EIL), an electron transport layer (ETL), a hole transport layer (HTL), and a hole injection layer (HIL) may be selectively inserted between the respective electrodes and the emission layer.

SUMMARY

Embodiments are directed to a deposition apparatus including a deposition source that receives a deposition material, and a plurality of spray nozzles arranged in a first direction at one side of the deposition source to spray the deposition material to a facing substrate. The deposition source includes a center area and outer areas, the outer areas being at respective ends of the center area with reference to the first direction. The spray nozzles include first spray nozzles arranged in each outer area and extending outwardly from the deposition source, a surface forming an end of the first spray nozzles forming a first inclination angle with a substrate surface in the first direction.

A center of the substrate in the first direction and a center of the deposition source in the first direction may be aligned. The center area of the deposition source may have a length in the first direction satisfying a condition as follows:

$$L_1 = \frac{2T}{\tan\theta} - L_2$$

wherein L1 is the length of the center area in the first direction, L2 is a deposition area length of the substrate in the first direction, T is a distance between the substrate and an end of the spray nozzles, and $\theta$ is the first inclination angle.

The first inclination angle may be in a range of 43-53 degrees.

The first inclination angle may be in a range of 25-35 degrees.

Second spray nozzles arranged at the center area may extend toward the deposition source such that a surface forming an end of the second spray nozzles has a second inclination angle in the first direction with respect to the substrate surface. The second inclination angle may be smaller than the first inclination angle.

The first spray nozzles may be symmetrically arranged in the first direction with reference to a center of the deposition source.

Embodiments are also directed to a method of manufacturing an organic light emitting diode (OLED) display including providing a deposition apparatus including a deposition source receiving a deposition material and a plurality of spray nozzles arranged in a first direction at one side of the deposition source to spray the deposition material to a substrate, disposing the substrate to face the spray nozzles, and spraying the deposition material through the spray nozzles while moving the deposition source in a second direction crossing the first direction. The deposition source includes a center area and outer areas, the outer areas being at respective ends of the center area with reference to the first direction. First spray nozzles arranged in each outer area spray the deposition material from the deposition source at a first inclination angle in the first direction.

The first spray nozzles may include a surface forming an end thereof, the surface being inclined in an outside direction with respect to a substrate surface while having the first inclination angle in the first direction.

A center of the substrate in the first direction and a center of the deposition source in the first direction may be aligned. The center area may have a length in the first direction satisfying a condition as follows:

$$L_1 = \frac{2T}{\tan\theta} - L_2$$

wherein L1 is the length of the center area in the first direction, L2 is a deposition area length of the substrate in the first direction, T is a distance between the substrate and an end of the spray nozzles, and $\theta$ is the first inclination angle.

The first inclination angle may be in a range of 43-53 degrees.

The first inclination angle may be in a range of 25-35 degrees.

The first spray nozzles may be symmetrically arranged in the first direction with reference to a center of the deposition source.

Second spray nozzles may be arranged at the center area and may be inclined in an outer direction of the deposition source. A surface forming an end of the second spray nozzles may have a second inclination angle in the first direction with respect to a substrate surface. The second inclination angle may be smaller than the first inclination angle.

BRIEF DESCRIPTION OF THE DRAWINGS

Features will become apparent to those of skill in the art by describing in detail exemplary embodiments with reference to the attached drawings in which.

DETAILED DESCRIPTION

Example embodiments will now be described more fully hereinafter with reference to the accompanying drawings; however, they may be embodied in different forms and should not be construed as limited to the embodiments set forth herein. Rather, these embodiments are provided so that this disclosure will be thorough and complete, and will fully convey exemplary implementations to those skilled in the art.

In the drawing figures, the dimensions of layers and regions may be exaggerated for clarity of illustration. Like reference numerals refer to like elements throughout.

In addition, unless explicitly described to the contrary, the word "comprise" and variations such as "comprises" or "comprising" will be understood to imply the inclusion of stated elements but not the exclusion of any other elements. Further, throughout this specification, the word "on" will be understood to mean positioned above or below a target portion, and will not necessarily be understood to mean positioned at an upper side based on a gravity direction.

Figure 1:
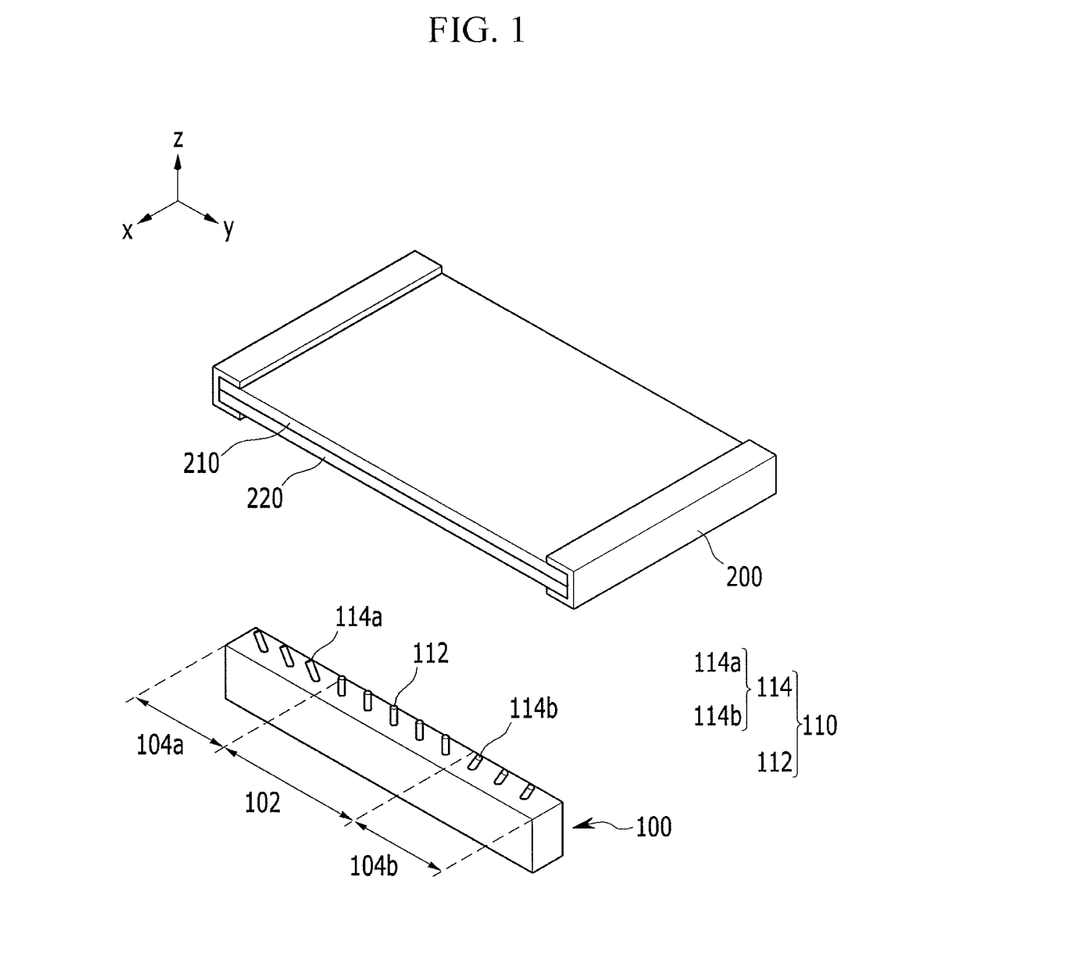
FIG. 1 illustrates a perspective view of a deposition apparatus according to an exemplary embodiment.

FIG. 1 illustrates a perspective view of a deposition apparatus according to an exemplary embodiment.

For convenience of the description, although a chamber is not shown in each drawing, the constituent elements of FIG. 1 may be disposed in a vacuum chamber in which the degree of vacuum is properly maintained. The vacuum chamber may have various shapes according a shape of a processed substrate. For example, in the case where the processed substrate has a circular shape, the vacuum chamber may have a cylindrical shape as a whole, and in the case where the processed substrate has a rectangular shape, the vacuum chamber may have a rectangular parallelepiped shape. In addition, in the vacuum chamber, a vacuum pump (not shown) that discharges gas from the vacuum chamber to lower pressure in the vacuum chamber, a vent (not shown) that injects a gas into the vacuum chamber to increase the pressure in the vacuum chamber, and the like, may be further included.

A depositing source 100 discharges a deposition material to deposit the deposition material on a deposition mask 210. The depositing source includes a space (not shown) for storing the deposition material, such as an organic material, therein. The storing space of the deposition material may be made of suitable materials having excellent thermal radiation and thermal resistance, such as alumina ($Al_2O_3$) or aluminum nitride (AlN). A heater (not shown) configured to contact and surround an outer surface may be provided at the outer surface of the storing space of the deposition material. The heater may serve to heat and vaporize the stored deposition material. The deposition source 100 is elongated in a first direction (for example, a y-axis direction) of the facing substrate 210. The deposition source 100 is divided into a center area 102 and outer areas 104a and 104b at both ends of the center area 102 with reference to the first direction. Spray angles of spray nozzles 110 disposed at the center area 102 and spray nozzles disposed at the outer area 104 may be different from each other, as will be described below.

The spray nozzles 110 to spray the deposition material are formed at one side of the deposition source 100 facing the substrate 210. The spray nozzles 110 may be formed with a circular tube shape and may be connected to an inner space of the deposition source 100 thereby spraying the deposition material that is vaporized or sublimated in the inner space to the substrate 210.

Multiple spray nozzles 110 are provided and are arranged in one line according to the deposition source 100 that is elongated in the first direction. The substrate 210 to receive the deposition material may be formed with a rectangular plate shape. In this case, a plurality of spray nozzles 110 may be linearly arranged in the first direction to be parallel to one edge of the substrate 210. As shown in FIG. 1, the spray nozzles 110 may be arranged in a line, for example. In other implementations, the spray nozzles 110 may be arranged in two or more lines. First spray nozzles 114a and 114b that are respectively arranged at the outer areas 104a and 104b of the deposition source 100 are formed to have an end cross-section thereof that is inclined toward an outer direction of the deposition source 100 while forming a first inclination angle with the surface of the substrate 210 in the first direction. Second spray nozzles 112 arranged in the center area 102 of the deposition source 100 are formed to have an end cross-section thereof that is parallel to the surface of the substrate 210.

The substrate 210 is fixed to face the depositing source 100 by the substrate fixing unit 200. The substrate fixing unit 200 stably fixes the substrate 210 while a thin layer is formed on the substrate 210 and carries the substrate 210 out after the processing is completed. Accordingly, substrate fixing unit 200 may have a structure that is capable of easily attaching and detaching the substrate 210. The substrate 210 is fixed to the substrate fixing unit 200 along with a deposition mask 220 that is used to form a pattern of an organic layer on the substrate 210. Openings are formed between shield parts of the deposition mask 220 such that the organic material may be deposited on the substrate 210 through the openings. The configuration of the substrate fixing unit 200 may be the same as the configuration used in a general depositing apparatus. The center in the first direction of the substrate 210 may be arranged and disposed to accord with the center of the first direction of the deposition source 100.

The deposition may be performed while the depositing source 100 and the substrate 210 move relative to each other. In the case where the substrate 210 is fixed, the deposition source 100 may move in the second direction (for example, an x-axis direction) crossing the first direction so that the deposition source 100 moves at a predetermined distance from the substrate 210. When the deposition source 100 is disposed to emit the deposition material in the vertical direction, the substrate 210 may be disposed in parallel over the deposition source 100. When the deposition source 100 is disposed to emit the deposition material in the horizontal direction, the substrate 210 may be disposed vertically. In an exemplary embodiment, the deposition source 100 is disposed at a bottom surface of a vacuum chamber, and the substrate 210 is horizontally disposed above the deposition source 100.

Before explaining the spray direction of the spray nozzle 110, a distribution of the deposition material sprayed from the spray nozzle will be described.

Figure 2:
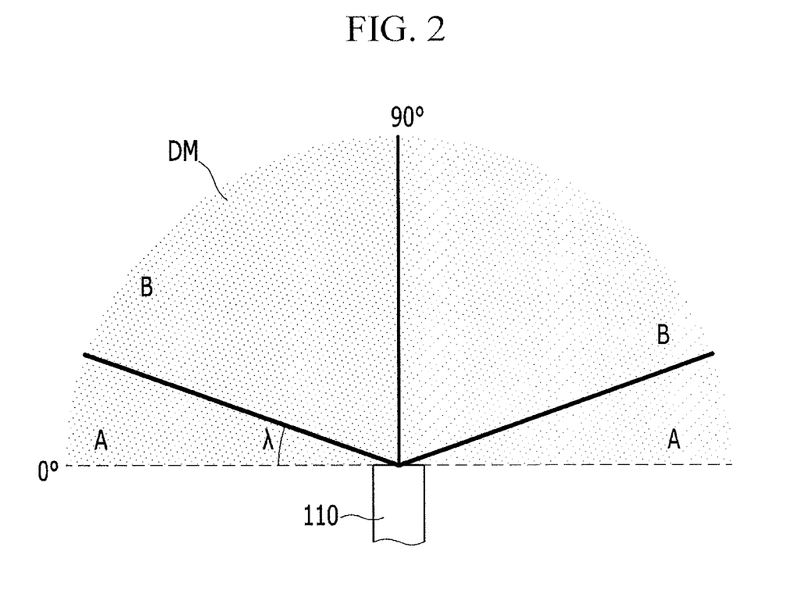
FIG. 2 and FIG. 3 illustrate schematic views of a distribution of a deposition material sprayed from a spray nozzle in a deposition apparatus according to an exemplary embodiment.
Figure 3:
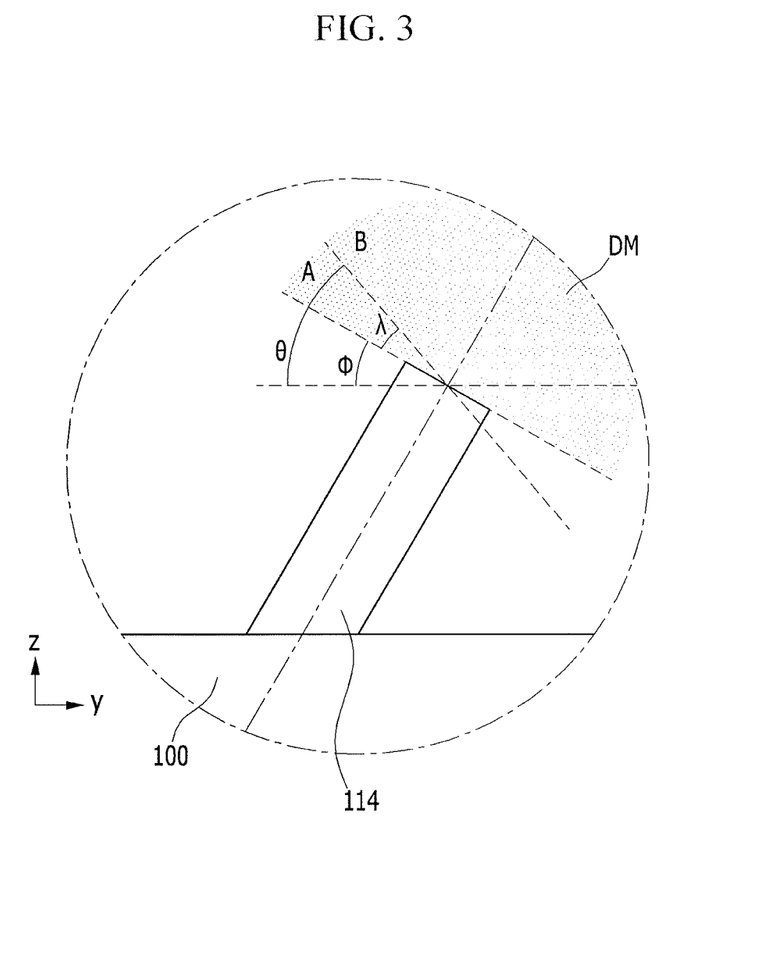

FIG. 2 and FIG. 3 illustrate schematic views of a distribution of a deposition material sprayed from a spray nozzle in a deposition apparatus according to an exemplary embodiment. For convenience, the deposition mask 220 close to the substrate 210 is omitted.

A deposition material DM sprayed from the spray nozzle 110 is sprayed under vacuum. As shown in FIG. 2, the deposition material DM is sprayed at an angle of 0-90° with reference of the end cross-section of the spray nozzle 110 without a specific direction, that is, in all directions of an end side. Accordingly, the angle of the end cross-section of the spray nozzle 110 may be considered rather than a formation angle of the spray nozzle 110. If a spray area where the deposition material DM is sprayed is divided into an area A and an area B according to the spread angle of the deposition material DM and a distribution ratio, Table 1 is provided as follows.

TABLE 1

| Spray area division | Spread angle (°) | Distribution ratio (%) |
|---|---|---|
| A | 0-18 | 0.054 |
| B | 18-90 | 99.946 |

As the spray angle is increased from 0°, a deposition amount of the deposition material is increased. When the spray angle is 90°, the deposition amount is a maximum. The deposition amount of the deposition material steeply increases from the spray angle of about 18°. Referring to FIGS. 2 and 3, the area A is an area having a spray angle from 0° to 18° with reference to the end cross-section of the spray nozzle 110, and the area B is an area having a spray angle from 18° to 90°. The deposition material DM distributed in the area A, among the deposition material DM sprayed from the spray nozzle 110, corresponds to 0.054%. In this case, the influence of the deposition material DM having the spray angle corresponding to the area A is relatively small for the substrate 210. On the other hand, the deposition material DM having the spray angle corresponding to the area B is mainly deposited onto the substrate 210 such that the area B having the spray angle corresponding to 18-90° may be defined as an effective spray area. The effective spray area may be changed according to the kind of deposition material. Determining an angle of the end cross-section of the spray nozzle 110 for the substrate 210 by considering the angle λ corresponding to the area A will be described below.

Figure 4:
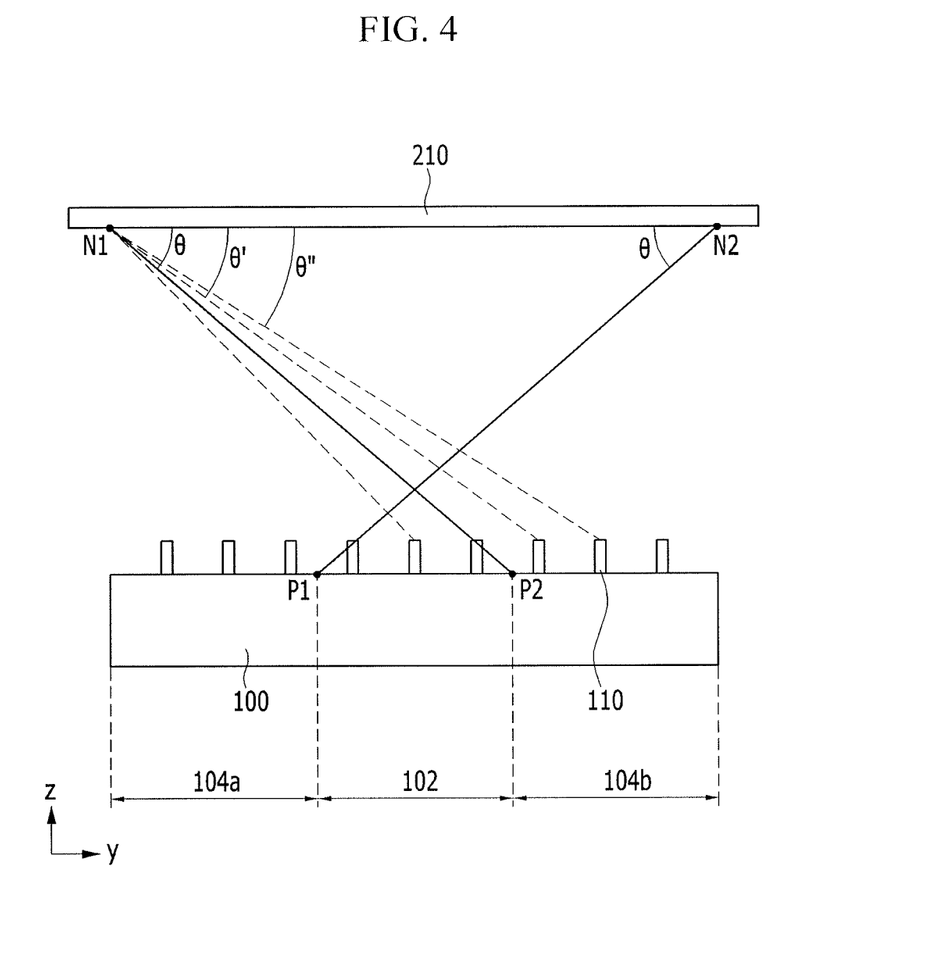
FIG. 4 illustrates a schematic view showing a correlation of a position between an incident angle of a deposition material that is incident to a substrate and a spray nozzle in a deposition apparatus according to an exemplary embodiment.

FIG. 4 illustrates a schematic view showing a correlation between an incident angle of a deposition material that is incident to a substrate and a location of a spray nozzle in a deposition apparatus according to an exemplary embodiment.

When the deposition material is deposited onto the substrate 210, the deposition material is incident while forming a predetermined angle (θ) with the substrate 210 with reference to the first direction. In this case, a minimum incident angle of the deposition material may be determined by considering a distance between the substrate 210 and the deposition source 100, a size of the substrate 210, and a deposition amount. For example, the minimum incident angle of the determined incident angle may be in a range of 43-53°. When the minimum incident angle of the deposition material is 43° or greater, a shadow phenomenon in which the deposition material penetrates between the deposition mask 220 and the substrate 210 may be reduced or prevented. When the minimum angle is less than 53°, the amount of the incident deposition material is sufficient such that the deposition efficiency is increased. Unless otherwise specifically stated, the incident angle and the angle related thereto are determined with reference to the first direction.

An area in which the deposition material is deposited on the substrate 210 with a predetermined thickness is referred to as a deposition area. The deposition area has outermost positions N1 and N2 in the first direction (the y-axis direction) as shown in FIG. 2. If the minimum incident angle of the deposition material is referred to as θ, when an arbitrary line having the inclination angle θ corresponding to the minimum incident angle is extended from the position N1, the arbitrary line meets a position P2 that is one position of the deposition source 100. Similarly, with respect to the position N2, when an arbitrary line having an angle θ is extended, the arbitrary line meets a position P1 that is one position of the deposition source 100. The area between the positions P1 and P2 is referred to as a center area 102, and an area determined outside the position P1 and an area determined outside the position P2 are referred to as outer areas 104a and 104b.

The spray nozzles 112 formed at the center area may spray the deposition material with an incident angle of the deposition material that is larger than or equal to the minimum incident angle θ for any position of the deposition area between the positions N1 and N2. On the other hand, the spray nozzles 114a and 114b formed at the outer areas outside the positions P1 and P2 have incident angles θ' and θ" that are smaller than the predetermined minimum incident angle θ, as shown in FIG. 4.

Therefore, it is desirable to control the incident angle for the deposition material sprayed from the spray nozzles 114a and 114b disposed at the outer areas 104a and 104b. As described above, the deposition material is sprayed in all directions of the front side of the end cross-sections of the spray nozzles. Accordingly, as shown in FIG. 3, the inclination angle (φ) between the end cross-sections of the spray nozzles and the substrate 210 becomes the incident angle (θ) at which the deposition material is incident to the substrate 210. The spray nozzles 114a and 114b disposed at the outer areas 104a and 104b are disposed for the end cross-sections to be inclined toward the outer directions of the deposition source 100. That is, when the determined incident angle (θ) is within the range of 43-53°, the end cross-sections of the spray nozzle may be formed such that the inclination angle (φ) with the surface of the substrate 210 is within the range of 43-53°. Also, if the angle (λ) of 18° corresponding to the area A is considered, the end cross-sections of the spray nozzles may be formed such that the inclination angle with the surface of the substrate 210 is within the range of 25-35°. The spray nozzles 112 disposed at the center area 102 may be obliquely disposed in order for the end cross-sections to accord with the outer direction of the deposition source 100. In this case, the inclination angle of the spray nozzles 112 disposed at the center area 102 may be determined to be smaller than the inclination angle of the spray nozzles 114a and 114b disposed at the outer areas 104a and 104b.

Figure 5:
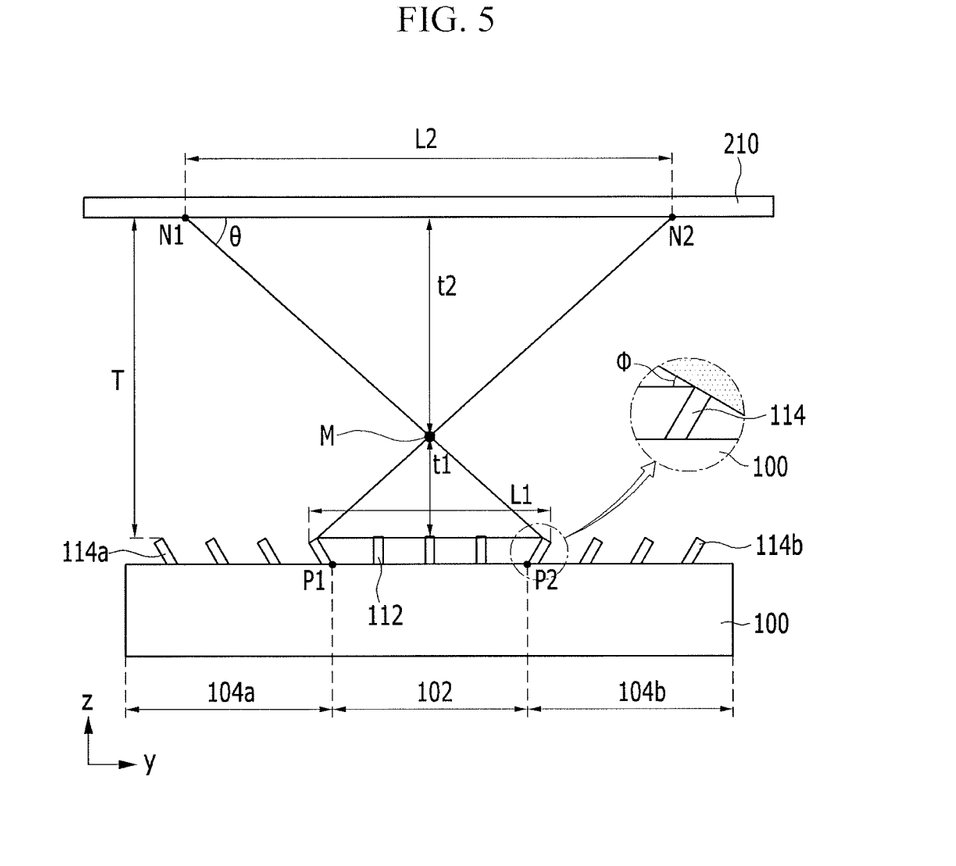
FIG. 5 illustrates a schematic view of a method of determining a center area and an outer area in a deposition apparatus according to an exemplary embodiment.

A method of determining the size of the center area 102 and the outer areas 104a and 104b of the deposition source 100 will now be described. FIG. 5 illustrates a schematic view of a method for determining a center area and outer areas in a deposition apparatus according to an exemplary embodiment.

The substrate 210 and the deposition source 100 may be positioned such that the center in the first direction of the substrate 210 and the center in the first direction of the deposition source 100 are aligned. Also, when a length in the first direction of the center area 102 is referred to as L1, a length in the first direction of the predetermined deposition area at the substrate 210 is referred to as L2, a distance between the substrate 210 and the end of the spray nozzle is referred to as T, and the predetermined incident angle is referred to as θ, and further, as shown in FIG. 5, when a cross point of a segment N1P2 and a segment N2P1 is M, a distance between the cross point M and the end of the spray nozzle is referred to as $t_1$, and a distance between the cross point M and the substrate 210 is referred to as $t_2$, relationships therebetween may be represented as follows.

$$L1 = \frac{2t_1}{\tan\theta} \quad \text{(Equation 1)}$$

Since $t_1 + t_2 = T$, if $t_1 = T - t_2$ is substituted to Equation 1, Equation 2 may be represented as follows.

$$L1 = \frac{2(T - t_2)}{\tan\theta} \quad \text{(Equation 2)}$$

Referring to FIG. 3, $t_2$ may be represented as in Equation 3.

$$t_2 = \frac{L_2 \tan\theta}{2} \quad \text{(Equation 3)}$$

If Equation 3 is substituted to Equation 2, Equation 4 may be represented as follows.

$$L_1 = \frac{2T}{\tan\theta} - L_2 \quad \text{(Equation 4)}$$

That is, the length $L_1$ in the first direction of the center area 102 may be represented by a relationship equation related to the predetermined inclination angle ($\theta$), the distance (T) between the substrate 210 and the spray nozzles 112 and 114, and the deposition area length $L_2$ of the substrate 210.

The remainder of the portion corresponding to the length $L_1$ in the first direction of the center area 102 in the deposition source 100 becomes the outer areas 104a and 104b.

Figure 6:
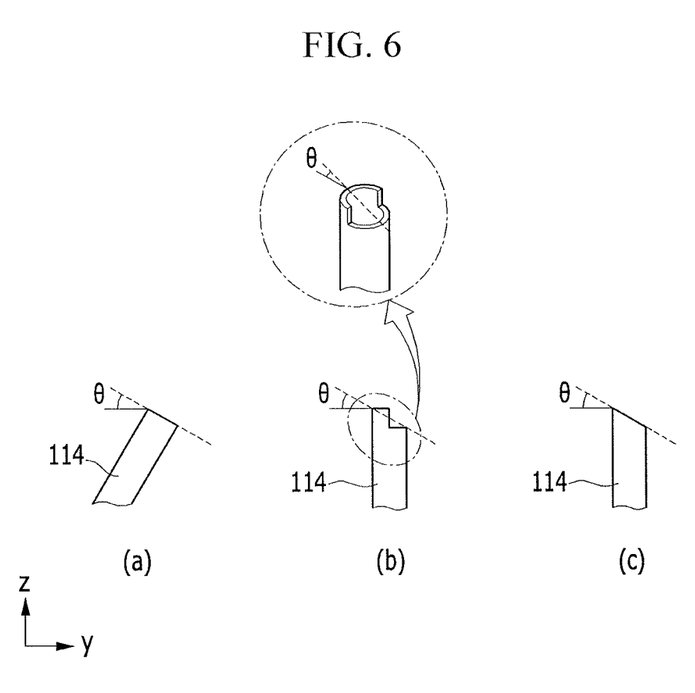
FIG. 6 illustrates side views of exemplary variations (a), (b), and (c) of a spray nozzle of a deposition apparatus according to an exemplary embodiment.

FIG. 6 illustrates side views of an exemplary variations (a), (b), and (c) of a spray nozzle of a deposition apparatus according to exemplary embodiments.

For a spray nozzle 114 disposed at the outer areas 104a and 104b, as shown in FIG. 6(a), the direction of the spray nozzle 114 may be inclined such that the end cross-section may have an inclination angle ($\theta$) with the surface of the substrate 210. When the spray nozzle 114 is disposed perpendicular to the substrate 210 as shown in FIG. 6(b), the shape of the end may be asymmetrical such that the spray amount in the first direction may be different. When an imaginary line contacting the end in the first direction is extended, the angle of the line may represent the inclination angle ($\theta$) with the surface of the substrate 210. As shown in FIG. 6(c), the spray nozzle 114 may be disposed perpendicular to the substrate 210, but the end cross-section may have the inclination angle ($\theta$) with the surface of the substrate 210. According to other implementations, the shape of the spray nozzle 114 may vary. If the angle of the end cross-section of the spray nozzle 114 is inclined in the first direction, the spray nozzle may be variously changed.

Next, referring to accompanying drawings, an operation of the deposition apparatus and a manufacturing method according to an organic light emitting diode (OLED) display according to an exemplary embodiment will be described.

First, the substrate 210 is inserted into the vacuum chamber (not shown), and the substrate 210 is disposed to oppose the deposition source 100 that emits the deposition material. At this time, the distance between the deposition source 100 and the substrate 210 is controlled for the deposition material to be incident at the predetermined incident angle ($\theta$). The substrate 210 may be disposed to satisfy Equation 4.

The deposition material is sprayed through the spray nozzles 110 while the deposition source 100 is moved in the second direction (the x-axis direction) crossing the first direction. The first spray nozzles 114 arranged at the outer area spray the deposition material with the inclination angle $\phi$ in the first direction. As shown in FIG. 5, the deposition material is attached to the substrate 210 with the incident angle $\theta$ of the size that is larger than or equal to the inclination angle.

This deposition material may be for an organic emission layer in the organic light emitting diode (OLED) display. That is, the deposition material may be an organic material forming subpixels representing R (red), G (green), and B (blue).

By way of summation and review, in manufacturing a flat display such as an organic light emitting diode (OLED) display, a vacuum deposition method may be used. A thin film of an organic material or an electrode material may be formed on a flat plate by depositing the corresponding material in a vacuum condition. According to the vacuum deposition method, a substrate where an organic film is grown may be disposed in the vacuum chamber, a fine metal mask (FMM) having a pattern that is the same as a pattern of a thin film to be formed may be attached, and the organic material may be vaporized or sublimated using a deposition source unit and thus deposited to the substrate.

However, a shadow phenomenon in which an organic material penetrates between the deposition mask and the substrate may be generated when a deposition material is sprayed and reaches the substrate.

In contrast, embodiments may provide a deposition apparatus and manufacturing method of an organic light emitting diode (OLED) display in which an angle at which a deposition material is sprayed is controlled. Embodiments may provide a deposition apparatus and method that increases an incident angle at which a deposition material is incident to a substrate. By increasing the incident angle of the deposition material that is incident to the substrate, a shadow phenomenon in which the deposition material penetrates between the deposition mask and the substrate may be reduced or suppressed, a deposition margin may be reduced, and deposition uniformity and deposition efficiency may be increased. Accordingly, high resolution of the organic light emitting diode (OLED) display may be realized.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope thereof as set forth in the following claims.

What is claimed is:
1. A deposition apparatus, comprising:
  a deposition source that receives a deposition material; and
  a plurality of spray nozzles arranged in a first direction at one side of the deposition source to spray the deposition material to a facing substrate,
  wherein:

the deposition source includes a center area and outer areas, the outer areas being at respective ends of the center area with reference to the first direction, the spray nozzles include first spray nozzles arranged in each outer area and extending outwardly from the deposition source, the first spray nozzles each being inclined away from the center area, a surface forming an end of the first spray nozzles forming a first inclination angle with a substrate surface in the first direction, a center of the substrate in the first direction and a center of the deposition source in the first direction are aligned, the center area of the deposition source has a length in the first direction satisfying a condition as follows:

$$L_1 = \frac{2T}{\tan\theta} - L_2$$

wherein L1 is the length of the center area in the first direction, L2 is a deposition area length of the substrate in the first direction, T is a distance between the substrate and an end of the spray nozzles, and θ is the first inclination angle, second spray nozzles arranged at the center area extend from the deposition source such that a surface forming an end of the second spray nozzles has a second inclination angle in the first direction with respect to the substrate surface, and the second inclination angle is smaller than the first inclination angle.

2. A deposition apparatus, comprising:

a deposition source that receives a deposition material; and a plurality of spray nozzles arranged in a first direction at one side of the deposition source to spray the deposition material to a facing substrate, wherein:

the deposition source includes a center area and outer areas, the outer areas being at respective ends of the center area with reference to the first direction, the spray nozzles include first spray nozzles arranged in each outer area and extending outwardly from the deposition source, a surface forming an end of the first spray nozzles forming a first inclination angle with a substrate surface in the first direction, a center of the substrate in the first direction and a center of the deposition source in the first direction are aligned, the center area of the deposition source has a length in the first direction satisfying a condition as follows:

$$L_1 = \frac{2T}{\tan\theta} - L_2$$

wherein L1 is the length of the center area in the first direction, L2 is a deposition area length of the substrate in the first direction, T is a distance between the substrate and an end of the spray nozzles, and θ is the first inclination angle, second spray nozzles arranged at the center area extend from the deposition source such that a surface forming an end of the second spray nozzles has a second inclination angle in the first direction with respect to the substrate surface, and the second inclination angle is smaller than the first inclination angle.

3. The deposition apparatus as claimed in claim 2, wherein the first inclination angle is in a range of 43-53 degrees.

4. The deposition apparatus as claimed in claim 2, wherein the first inclination angle is in a range of 25-35 degrees.

5. The deposition apparatus as claimed in claim 2, wherein the first spray nozzles are symmetrically arranged in the first direction with reference to a center of the deposition source.

6. A method of manufacturing an organic light emitting diode (OLED) display, the method comprising:

providing a deposition apparatus including a deposition source receiving a deposition material and a plurality of spray nozzles arranged in a first direction at one side of the deposition source to spray the deposition material to a substrate;

disposing the substrate to face the spray nozzles; and spraying the deposition material through the spray nozzles while moving the deposition source in a second direction crossing the first direction, wherein:

the deposition source includes a center area and outer areas, the outer areas being at respective ends of the center area with reference to the first direction, first spray nozzles arranged in each outer area spray the deposition material from the deposition source at a first inclination angle in the first direction, a center of the substrate in the first direction and a center of the deposition source in the first direction are aligned, the center area of the deposition source has a length in the first direction satisfying a condition as follows:

$$L_1 = \frac{2T}{\tan\theta} - L_2$$

wherein L1 is the length of the center area in the first direction, L2 is a deposition area length of the substrate in the first direction, T is a distance between the substrate and an end of the spray nozzles, and θ is the first inclination angle, second spray nozzles arranged at the center area extend from the deposition source such that a surface forming an end of the second spray nozzles has a second inclination angle in the first direction with respect to the substrate surface, and the second inclination angle is smaller than the first inclination angle.

7. The method as claimed in claim 6, wherein the first spray nozzles include a surface forming an end thereof, the surface being inclined in an outside direction with respect to a substrate surface while having the first inclination angle in the first direction.

8. The method as claimed in claim 7, wherein the first inclination angle is in a range of 43-53 degrees.

9. The method as claimed in claim 7, wherein the first inclination angle is in a range of 25-35 degrees.

10. The method as claimed in claim 6, wherein the first spray nozzles are symmetrically arranged in the first direction with reference to a center of the deposition source.

* * * * *